United States Patent
Naritake (10) Patent No.: US 8,174,922 B2
(45) Date of Patent: May 8, 2012

(54) ANTI-FUSE MEMORY CELL AND SEMICONDUCTOR MEMORY DEVICE

(75) Inventor: Isao Naritake, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 220 days.

(21) Appl. No.: 12/662,649

(22) Filed: Apr. 27, 2010

(65) Prior Publication Data

US 2010/0271897 A1    Oct. 28, 2010

(30) Foreign Application Priority Data

Apr. 28, 2009    (JP) ................. 2009-109633

(51) Int. Cl.
*G11C 17/18* (2006.01)

(52) U.S. Cl. ...................... 365/225.7; 365/96

(58) Field of Classification Search ............... 365/225.7, 365/96

See application file for complete search history.

(56) References Cited

U.S. PATENT DOCUMENTS

| | | | |
|---|---|---|---|
| 6,590,797 B1 * | 7/2003 | Nachumovsky et al. | ....... 365/96 |
| 6,822,888 B2 | 11/2004 | Peng | |
| 7,349,281 B2 | 3/2008 | Kouchi et al. | |
| 2007/0058473 A1 | 3/2007 | Kouchi et al. | |

FOREIGN PATENT DOCUMENTS

| JP | 2000-299383 A | 10/2000 |
|---|---|---|
| JP | 2007-80302 A | 3/2007 |

* cited by examiner

*Primary Examiner* — Son Dinh
*Assistant Examiner* — Nam Nguyen
(74) *Attorney, Agent, or Firm* — McGinn IP Law Group, PLLC (57) ABSTRACT

An anti-fuse memory cell includes: a first transistor connected with a word line and configured to output a second voltage based on a first voltage supplied to the word line in a write mode; a second transistor connected with a bit line, and configured to output a third voltage supplied to the bit line when the second voltage is supplied to a gate of the second transistor in the write mode; and an anti-fuse element connected to a ground line, and having an insulator film. The insulator film is set to a conductive state with the third voltage supplied from the second transistor.

20 Claims, 6 Drawing Sheets

| | | Vb | Vwp | Vwr | Program |
|---|---|---|---|---|---|
| Program | SC/SR | 0 | VPP | VPP/2 | Yes |
| | SC/UR | 0 | 0 | 0 | No |
| | UC/SR | VPP/2 | VPP | VPP/2 | No |
| | UC/UR | VPP/2 | 0 | 0 | No |

ANTI-FUSE MEMORY CELL AND SEMICONDUCTOR MEMORY DEVICE

INCORPORATION BY REFERENCE

This patent application claims a priority on convention based on Japanese Patent Application No. 2009-109633. The disclosure thereof is incorporated herein by reference.

TECHNICAL FIELD

The present invention relates to an anti-fuse memory cell in which a data is programmed by use of an anti-fuse element, and a semiconductor memory device to which the anti-fuse memory cell is applied.

BACKGROUND ART

Conventional anti-fuse memory cells are disclosed in U.S. Pat. No. 6,822,888 (patent literature 1) and Japanese Patent Publication (JP 2007-80302A; patent literature 2).

Figure 1:
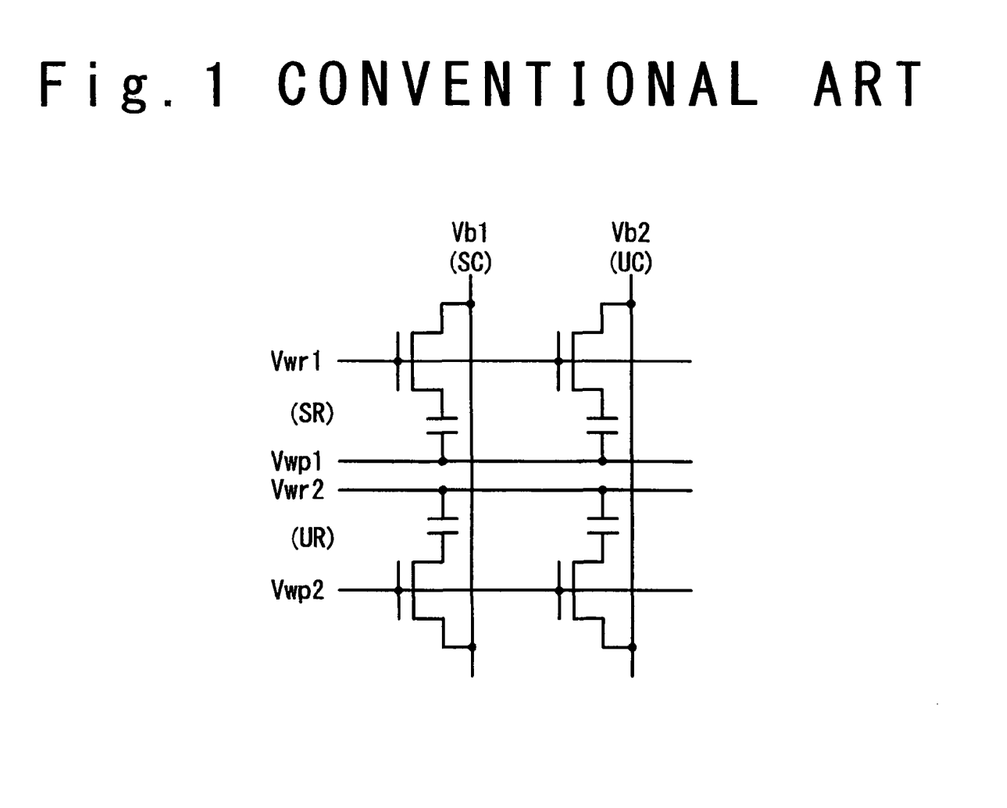
FIG. 1 shows a configuration of a conventional anti-fuse memory cell.

FIG. 1 shows a circuit configuration of a conventional anti-fuse memory cell disclosed in U.S. Pat. No. 6,822,888. The anti-fuse memory cell is arranged in a matrix. A plurality of word lines Vwr1 (SR), Vwr2 (UR), . . . , and a plurality of counter lines Vwp1 (SR), Vwp2 (UR), . . . , are connected to rows of a memory cell array, respectively. A plurality of bit lines Vb1 (SC), Vb2 (UC), . . . are connected thereto columns of the memory cell array, respectively.

The anti-fuse memory cell has one N-type MOS (Metal Oxide Semiconductor) transistor and one anti-fuse element. The anti-fuse element has first and second electrodes. The anti-fuse element is composed of an N-type MOS transistor and has a gate oxide film. For example, in a first anti-fuse memory cell, the N-type MOS transistor is connected between the bit line Vb1 (SC) and the first electrode of the anti-fuse element, and the gate is connected to the word line Vwr1 (SR). The second electrode of the anti-fuse element is connected to the counter line Vwp1 (SR). In a second anti-fuse memory cell, the N-type MOS transistor is connected between the bit line Vb1 (SC) and the first electrode of the anti-fuse element and the gate is connected to the word line Vwr2 (UR). The second electrode of the anti-fuse element is connected to the counter line Vwp2 (UR).

Citation List:
  Patent literature 1: U.S. Pat. No. 6,822,888
  Patent literature 2: JP 2007-80302A
  Patent literature 3: JP 2000-299383A

SUMMARY OF THE INVENTION

Figure 2:
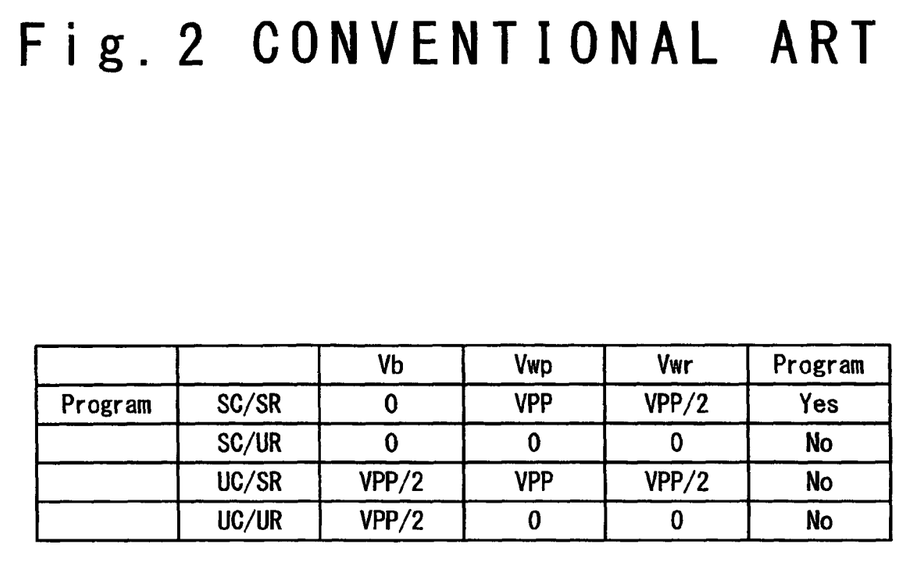
FIG. 2 shows an operation sequence of the anti-fuse memory cell shown in FIG. 1.

FIG. 2 shows an operation sequence of the anti-fuse memory cell shown in FIG. 1. In a programming operation, when the first anti-fuse memory cell is selected, voltages to be supplied to the bit line Vb1 (SC), the counter line Vwp1 (SR), and the word line Vwr1 (SR) are assumed to be 0, VPP, and VPP/2, respectively. In this case, the anti-fuse element of the first anti-fuse memory cell is supplied with the voltage VPP so that the gate oxide film of the anti-fuse element is broken down, so as to write a write data in the first anti-fuse memory cell. In this case, since the second anti-fuse memory is not selected, the voltages to be supplied to the bit line Vb1 (SC), the counter line Vwr1 (SR), and the word line Vwr1 (SR) need to be set to VPP/2, 0, and 0, respectively, so as to prevent the gate oxide film of the anti-fuse element of the second anti-fuse memory cell from being broken down.

In the technique disclosed in U.S. Pat. No. 6,822,888, it is necessary to perform the programming operation by controlling the voltage of the counter line (second electrode) of the anti-fuse element as well as the voltages of the word line and the bit line. For this operation, a constituent element for controlling the counter electrode and an operation sequence for controlling the counter electrode are required, resulting in making the configuration of the anti-fuse memory cell complex.

Also, a technique described in Japanese Patent Publication (JP 2007-80302A) is similar to that of U.S. Pat. No. 6,822, 888.

In an aspect of the present invention, an anti-fuse memory cell includes: a first transistor connected with a word line and configured to output a second voltage based on a first voltage supplied to the word line in a write mode; a second transistor connected with a bit line, and configured to output a third voltage supplied to the bit line when the second voltage is supplied to a gate of the second transistor in the write mode; and an anti-fuse element connected to a ground line, and having an insulator film. The insulator film is set to a conductive state with the third voltage supplied from the second transistor.

In another aspect of the present invention, a semiconductor memory device includes: a memory cell array in which the anti-fuse memory cells are arranged in a matrix, wherein each of the anti-fuse memory cells comprises:

a first transistor connected with a word line and configured to output a second voltage based on a first voltage supplied to the word line in a write mode;

a second transistor connected with a bit line, and configured to output a third voltage supplied to the bit line when the second voltage is supplied to a gate of the second transistor in the write mode; and an anti-fuse element connected to a ground line, and having an insulator film, wherein the insulator film is set to a conductive state with the third voltage supplied from the second transistor to write a write data. The semiconductor memory device further includes a plurality of word lines respectively connected with rows of the memory cell array; a plurality of bit lines respectively connected with columns of the memory cell array; a control circuit configured to output a row address and a column address in a write mode, a word driver configured to select one of the plurality of word lines based on the row address from the control circuit to drive the selected word line with the first voltage in the write mode; and a data driver configured to output the third voltage for the write data to one of the plurality of bit lines which is selected based on the column address from the control circuit in the write mode such that the write data is written in one anti-fuse memory cell connected with the selected word line and the selected column line, In still another aspect of the present invention, a method of accessing an anti-fuse memory cell is achieved by supplying a first voltage to one of a plurality of word lines which is selected based on a row address in a write mode; by generating a second voltage based on the first voltage supplied to the selected word line by a first MOS transistor; by supplying a third voltage to one of a plurality of bit lines which is selected based on a column address in the write mode; by outputting the third voltage to one electrode of an anti-fuse element by a second MOS transistor such that a data is written in the anti-fuse element, when the second voltage is supplied to a gate of the second MOS transistor in the write mode. The other electrode of the anti-fuse element is connected to a ground line, and an insulator film of the anti-fuse element is broken down with the third voltage such that the insulator film is set to a conductive state.

In the present invention, the anti-fuse memory cell is formed from two transistors M1 and M2 and one anti-fuse element AF. In this case, the number of transistors is more than in the conventional technique, but only the word line is single and the counter electrode of the anti-fuse element AF is grounded. Therefore, by controlling the voltages of the word line and the bit line, it possible to perform a programming operation.

Also, in the present invention, it is only necessary to set only two kinds of voltages, so that it is possible to perform the programming operation through simple voltage control.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF EMBODIMENTS

Hereinafter, a semiconductor memory device including an anti-fuse memory cell according to the present invention will be described in detail with reference to the attached drawings.

Figure 3:
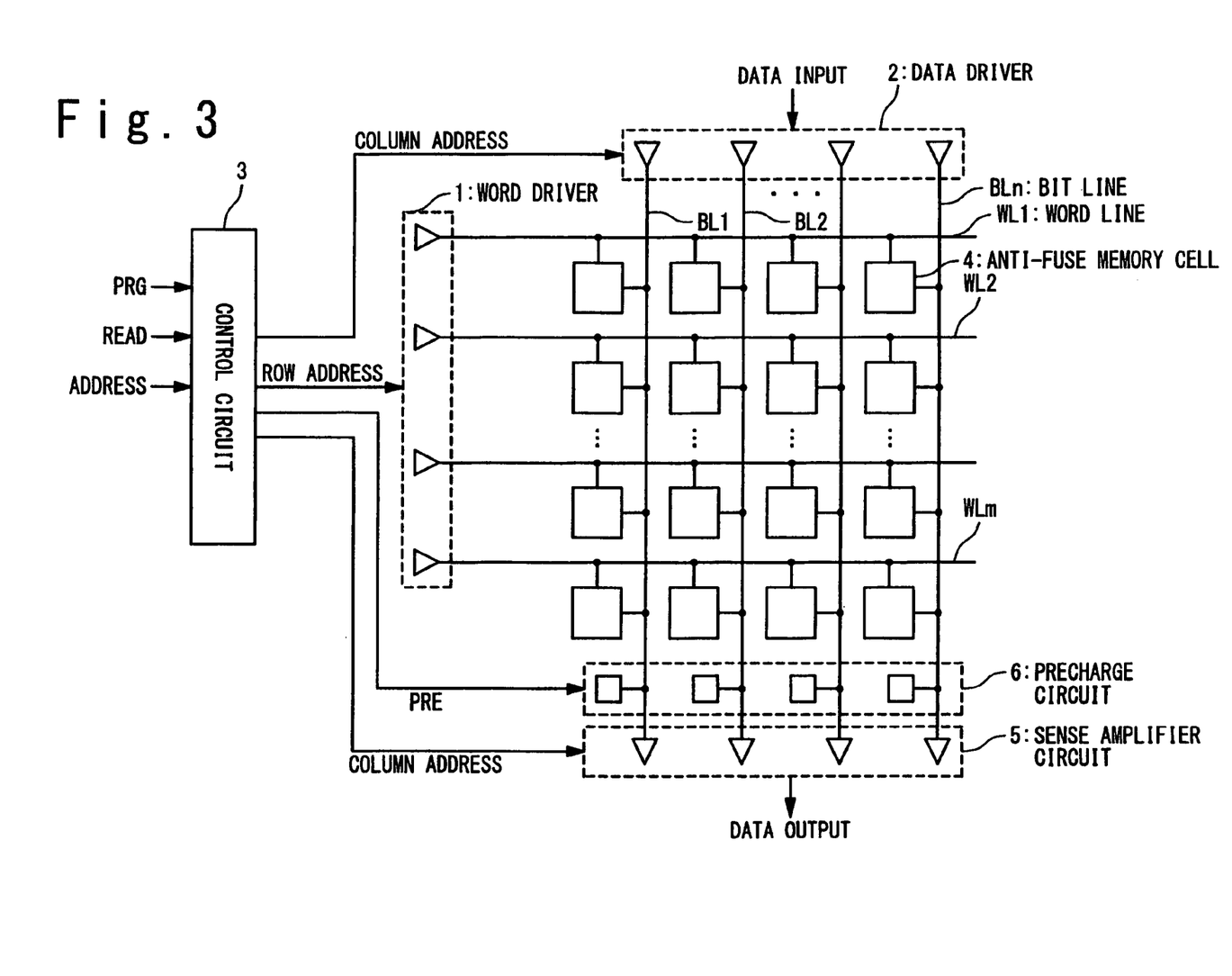
FIG. 3 shows a configuration of a semiconductor memory device to which an anti-fuse memory cells according to an embodiment of the present invention are applied.

FIG. 3 shows a configuration of a semiconductor memory device to which the anti-fuse memory cell 4 according to an embodiment of the present invention is applied. The semiconductor memory device has a word driver 1, a data driver 2, a control circuit 3, a memory cell array, a plurality of word lines WL1 to WLm, a plurality of bit lines BL1 to BLn, a sense amplifier circuit 5, and a precharge circuit 6. Here, the suffixes m, n are integers of 2 or more.

The word driver 1 contains a plurality of output buffers. The plurality of word lines WL1 to WLm are connected to the plurality of output buffers, respectively. Each of the plurality of word lines WL1 to WLm is selected based on a row address.

The data driver 2 has a plurality of output buffers. The plurality of bit lines BL1 to BLn are connected to the plurality of output buffers, respectively. Each of the plurality of word lines BL1 to BLn is selected based on a column address.

In the memory cell array, the anti-fuse memory cells 4 are arranged in a matrix of m rows and n columns. The configuration of the anti-fuse memory cell 4 will be described later. The rows of the memory cell array are connected to the plurality of word lines WL1 to WLm, respectively. The columns of the memory cell array are connected to the plurality of word lines BL1 to BLn, respectively. Specifically, the anti-fuse memory cell 4 located at the $i^{th}$ row (i =1, 2, ..., m) and the $j^{th}$ column (j=1, 2, ..., n) of the anti-fuse memory cells 4 is connected with a word line WLi of the plurality of word lines WL1 to WLm and a bit line BLj of the plurality of bit lines BL1 to BLn.

The sense amplifier circuit 5 contains a plurality of sense amplifier sections. The plurality of sense amplifier sections are connected to the plurality of bit lines BL1 to BLn, respectively. The precharge circuit 6 contains a plurality of precharge sections respectively provided for the plurality of sense amplifier sections. The plurality of precharge sections are connected to the plurality of bit lines BL1 to BLn, respectively.

The operation of the semiconductor memory device will be described.

First, a write operation (programming operation) will be described. The control circuit 3 receives a program mode signal PRG to indicate a write instruction and an address. The address includes a row address and a column address. In this case, the control circuit 3 outputs the row address to the word driver 1 and the column address to the data driver 2 in response to the program mode signal PRG.

The row address is supplied from the control circuit 3 to the word driver 1. The word driver 1 selects and drives the word line WLi of the word lines WL1 to WLm based on the row address. The column address is supplied from the control circuit 3 to the data driver 2. Also, a write data is supplied from an internal circuit (not shown) of a computer to the data driver 2. The data driver 2 selects and drives the bit line BLj of the plurality of bit lines BL1 to BLn based on the column address and outputs the write data to the bit line BLj. At this time, the write data is written in the anti-fuse memory cell 4 connected to the word line WLi and the bit line BLj.

Next, a read operation will be described. The control circuit 3 is supplied with a read mode signal READ indicating a read instruction and a read address. The read address includes a row address and a column address. In this case, the control circuit 3 outputs the row address to the word driver 1 and the column address to the sense amplifier circuit 5 in response to the read mode signal READ. Moreover, the control circuit 3 outputs a precharge signal PRE to the precharge circuit 6 only for a preset time in response to the read mode signal READ.

The row address is supplied from the control circuit 3 to the word driver 1. The word driver 1 selects and drives the word line WLi of the word lines WL1 to WLm in response to the row address.

The sense amplifier circuit 5 selects the bit line BLj of the plurality of bit lines BL1 to BLn in response to the column address. The precharge circuit 6 drives the bit line BLj in response to the precharge signal PRE. Specifically, the control circuit 3 outputs the column address to the sense amplifier circuit 5, and a specific sense amplifier section of the plurality of sense amplifier sections is selected in the sense amplifier circuit 5 in response to the column address. Thus, the bit line BLj of the plurality of bit lines BL1 to BLn which is connected to the specific sense amplifier section is selected. Further, a specific precharge section of the plurality of precharge sections which is provided for the specific sense amplifier section in the precharge circuit 6 is also selected. In this case, the selected precharge section drives the bit line BLj in response to the precharge signal PRE.

When the preset time passes, the precharge circuit 6 stops the driving of the bit line BLj. At this time, data is read out from the anti-fuse memory cell 4 connected to the word line WLi and the bit line BLj and is outputted as the read-out data to the internal circuit (not shown) via the sense amplifier circuit 5.

Figure 4:
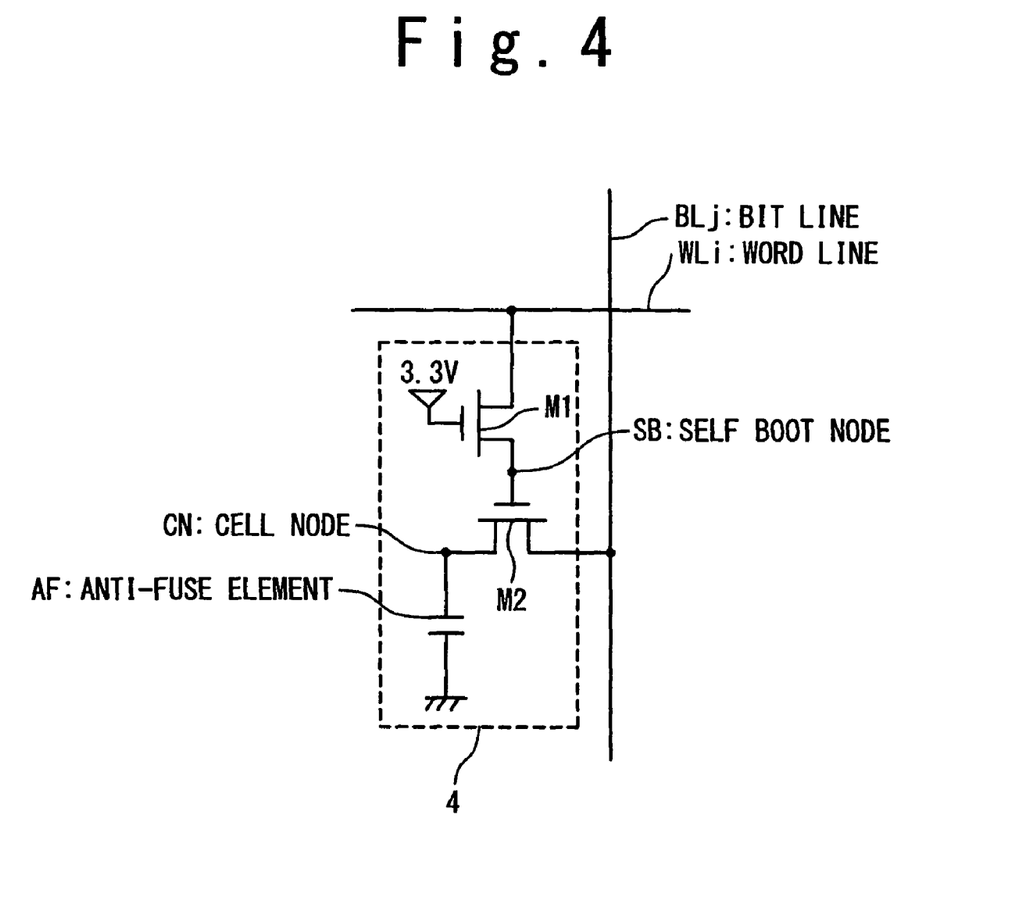
FIG. 4 shows the configuration of the anti-fuse memory cell according to the embodiment of the present invention.

FIG. 4 shows the configuration of the anti-fuse memory cell 4 according to the embodiment of the present invention connected to the word line WLi and the bit line BLj. The anti-fuse memory cell 4 has MOS transistors M1 and M2 and an anti-fuse element AF. The transistor M1 is connected between the word line WLi and a node (to be referred to as a "self-boot node SB"). The gate of the transistor M1 is always supplied with a voltage VIO. A high-voltage N-type MOS transistor with a high breakdown voltage for I/O is used as the transistor M1. The gate oxide film of the transistor M1 is optimized for an operation at the voltage of about 3.3 V, which is an I/O voltage, and is not broken down even if the voltage as high as 8 to 9 V is supplied to the transistor M1. For example, the voltage VIO is assumed to be 3.3 V.

The transistor M2 is connected between the bit line BLj and a node (to be referred to as a cell node CN). The gate of the MOS transistor M2 is connected to the self-boot node SB. As the transistor M2, the high-voltage N-type MOS transistor for I/O is used which is same as the transistor M1.

The anti-fuse element AF has an insulating film (insulator film) between the cell node CN and the ground. Specifically, the anti-fuse element AF has first and second electrodes, and the first electrode is connected to the cell node CN and the second electrode is grounded. Further, the anti-fuse element AF is made from an N-type MOS transistor and the insulator film is composed of a gate oxide film of the N-type MOS transistor. The gate oxide film of the anti-fuse element AF is optimized for an operation at the voltage of about 1.2 V and is thinner than the gate oxide films of the transistors M1 and M2. Thus, when the voltage higher than about 6 V is supplied to the gate oxide film of the anti-fuse element AF, the gate oxide film of the anti-fuse element AF is broken down, and a short circuit is formed between the cell node CN and the ground, that is, a conductive state is set that the cell node CN is connected to the ground. In the above-mentioned programming operation, a high voltage sufficient to break down the gate oxide film is applied to the anti-fuse element AF.

Figure 5:
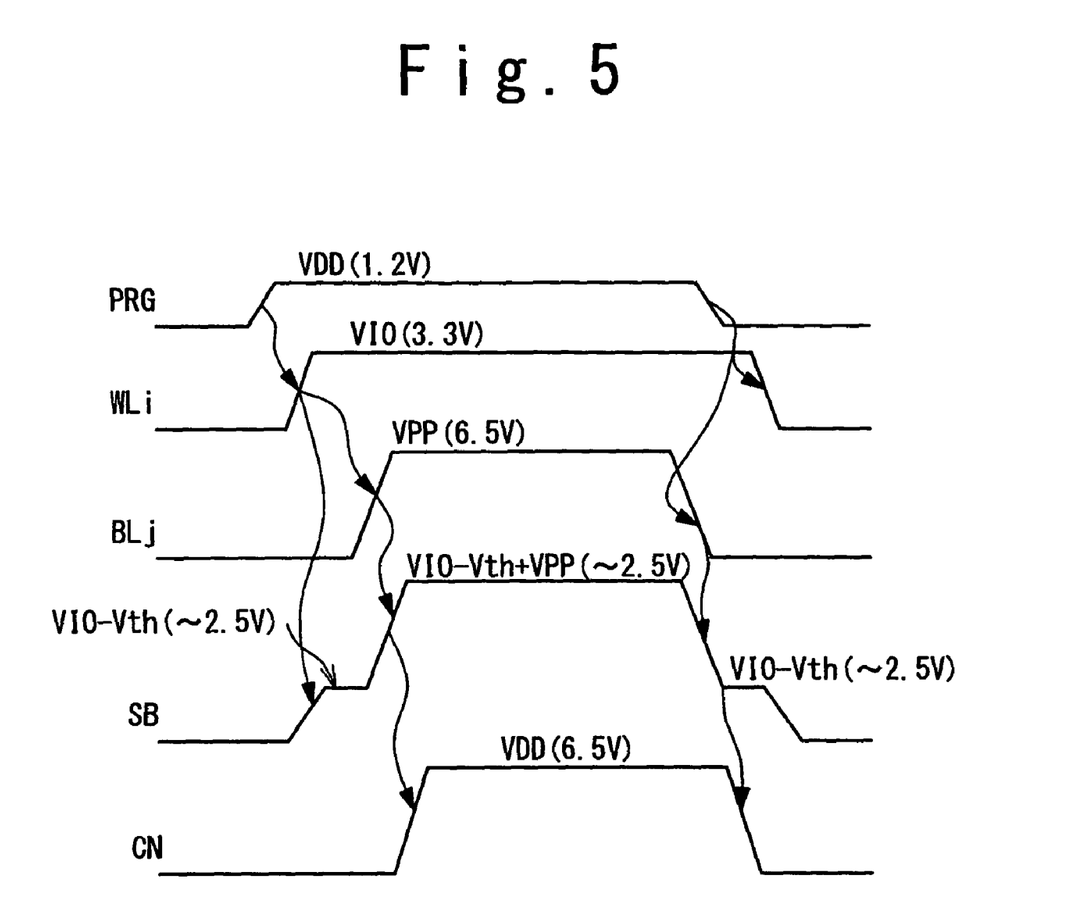
FIG. 5 shows timing charts in a write operation (programming operation) of the anti-fuse memory cell according to the embodiment of the present invention.

FIG. 5 shows timing charts in the programming operation. The control circuit 3 is supplied with the program mode signal PRG to indicate a write instruction and a write address (of a write row address and a write column address). When the program mode signal PRG is in an active state (in a high level), the voltage VDD of 1.2 V is supplied to the control circuit 3. In this case, the control circuit 3 outputs the write row address to the word driver 1 and the write column address to the data driver 2 in response to the program mode signal PRG (of the voltage VDD).

The word driver 1 is supplied with the write row address from the control circuit 3. The word driver 1 selects the word line WLi of the word lines WL1 to WLm based on the write row address and drives it with the voltage VIO. The voltage VIO is assumed to be 3.3 V as described above. Thus, the word line WLi is supplied with the voltage VIO. In this case, the transistor M1 outputs to the self-boot node SB, a voltage (VIO−Vth) which is lower by the threshold voltage Vth than the word line voltage VIO. The threshold voltage Vth is assumed to be about 0.8 V.

The data driver 2 is supplied with the write column address from the control circuit 3. Moreover, the data driver 2 is supplied with a write data as data from the internal circuit (not shown) of the computer. The data driver 2 selects the bit line BLj of the plurality of bit lines BL1 to BLn based on the write column address and outputs a voltage VPP as the write data to the bit line BLj. The voltage VPP is higher than the second voltage (VIO−Vth) and is assumed to be 6.5 V.

The gate of the transistor M2 is supplied with the second voltage (VIO−Vth) from the transistor M1 via the self-boot node SB, and the bit line BLj is supplied with the voltage VPP. In this case, a voltage (VIO−Vth+VPP), as a summation of the second voltage (VIO−Vth) and the voltage VPP, is generated by a parasitic capacitance between the self-boot note SB and the bit line BLj. The voltage (VIO−Vth+VPP) is set higher than a first set voltage (VPP+Vth) which is a summation of the third voltage VPP and the threshold voltage Vth of the transistor M2. In this case, the transistor M2 outputs the third voltage VPP from the bit line BLj to the cell node CN.

In this way, the anti-fuse element AF is supplied with the voltage VPP from the transistor M2 via the cell node CN. In this case, the gate oxide film of the anti-fuse element AF is broken down. Thus, the write data is written into the anti-fuse memory cell 4 connected to the word line WLi and the bit line BLj.

Figure 6:
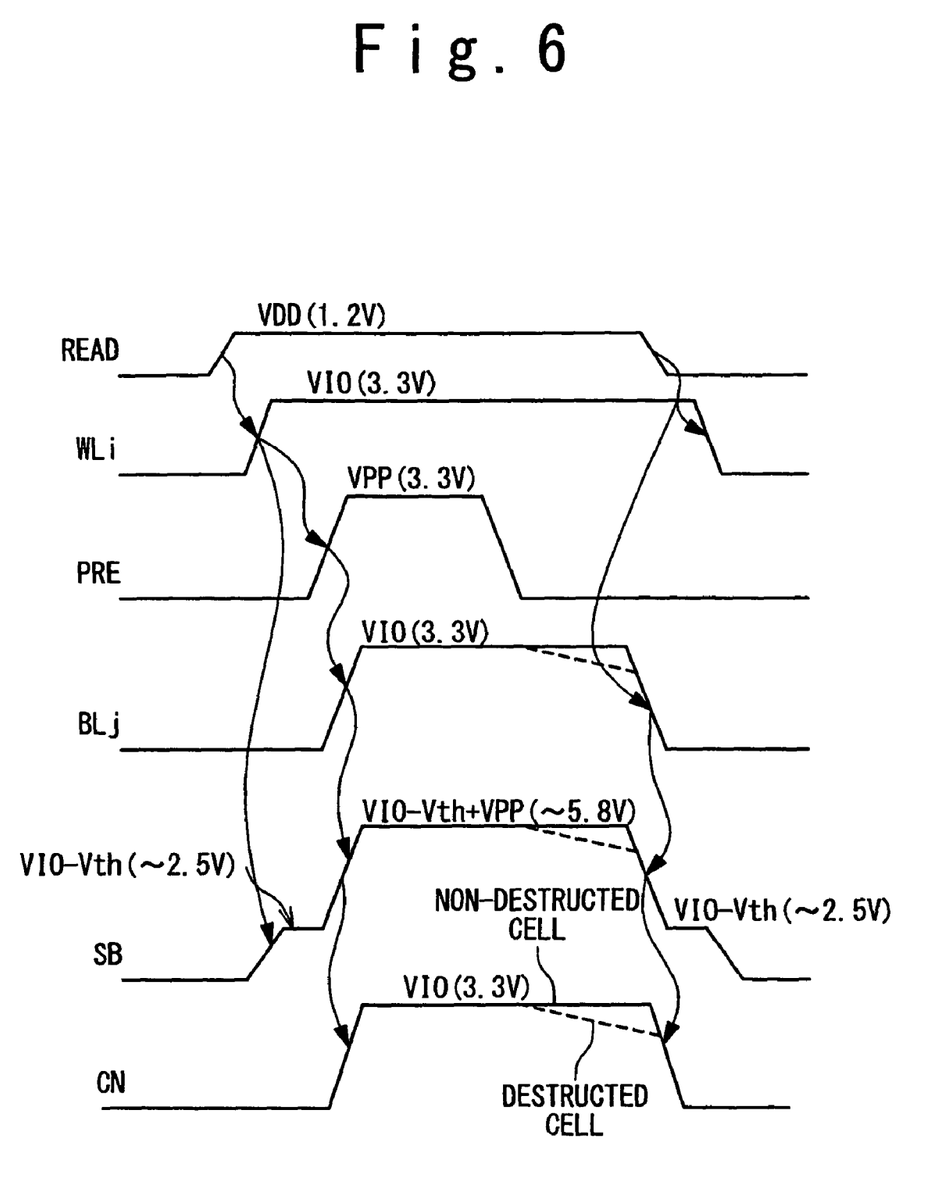
FIG. 6 shows timing charts in a read operation of the anti-fuse memory cell according to the embodiment of the present invention.

FIG. 6 shows timing charts in the read operation. The control circuit 3 is supplied with the read mode signal READ to indicate the read instruction and a read address (read row address and read column address). When the read mode signal READ is in an active state (high level), the voltage VDD of 1.2 V is supplied to the control circuit 3. In this case, the control circuit 3 outputs the read row address to the word driver 1 and the read column address to the sense amplifier circuit 5 in response to the read mode signal READ (voltage VDD). Also, the control circuit 3 outputs the precharge signal PRE to the precharge circuit 6 only for a preset time in response to the read mode signal READ (voltage VDD). When the precharge signal PRE is in the active state (high level), the precharge voltage VIO is supplied to the precharge circuit 6. The precharge voltage VIO is higher than the voltage (VIO−Vth) and is lower than the voltage VPP. The precharge voltage is the same as the gate voltage of the transistor M1.

The word driver 1 is supplied with the read row address from the control circuit 3. The word driver 1 selects the word line WLi of the word lines WL1 to WLm based on the read row address and drives with the voltage VIO. The word line WLi is supplied with the voltage VIO. In this case, the transistor M1 outputs to the self-boot node SB, the voltage (VIO−Vth) lower by the threshold voltage Vth than the voltage VIO.

The sense amplifier circuit 5 selects the bit line BLj of the plurality of bit lines BL1 to BLn based on the read column address. The precharge circuit 6 drives the bit line BLj with the voltage VIO in response to the precharge signal PRE. The gate of the transistor M2 is supplied with the voltage (VIO−Vth) from the transistor M1 via the self-boot node SB, and the bit line BLj is supplied with the voltage VIO. In this case, the voltage (VIO−Vth+VIO) as a summation of the voltage (VIO−Vth) and the voltage VIO, is generated by the parasitic capacitance between the self-boot note SB and the bit line BLj.

The voltage (VIO−Vth+VIO) is set higher than a second set voltage (VIO+Vth) as a summation of the voltage VIO and the threshold voltage Vth of the transistor M2. In this case, the transistor M2 outputs the voltage VIO supplied to the bit line BLj to the cell node CN. The anti-fuse element AF is supplied with the voltage VIO from the transistor M2 via the cell node CN.

The control circuit 3 outputs the precharge signal PRE to the precharge circuit 6 only for the preset time in response to the read mode signal READ (voltage VDD) and then stops the outputting of the precharge mode signal PRE. At this time, the precharge circuit 6 stops the driving of the bit line BLj. When the driving of the bit line BLj is stopped, a data is read out from the anti-fuse memory cell 4 connected to the word line WLi and the bit line BLj and is outputted as the above-mentioned read-out data to the sense amplifier circuit 5. Here, when the gate oxide film of the anti-fuse element AF is not broken, the voltage VIO supplied to the bit line BLj is almost kept. On the other hand, when the gate oxide film of the anti-fuse element AF is broken down, the cell node CN is connected to the ground via the anti-fuse element AF, and therefore the voltage VIO supplied to the bit line BLj is decreased by the anti-fuse element AF.

In the above description, the voltages VIO are assumed to be 3.3 V, but if the operation margin of the anti-fuse element AF can be ensured, the voltages VIO may be the voltage VDD (1.2 V).

As described above, in the present invention, it is possible to perform the programming operation without controlling the voltage level of the counter electrode of the anti-fuse element. The reason will be described below.

In the techniques described in U.S. Pat. No. 6,822,888, and Japanese Patent Publication (JP 2007-80302A), an anti-fuse memory cell includes one N-type MOS transistor and one anti-fuse element. In this case, it is necessary to perform the programming operation by controlling the voltage level of the counter electrode (second electrode) of the anti-fuse element as well as the voltage levels of the word line and the bit line. For this reason, a constituent element for controlling the counter electrode and an operation sequence for controlling the counter electrode are required, resulting in making the configuration of the anti-fuse memory cell complex.

On the other hand, in the present invention, the anti-fuse memory cell 4 is composed of two N-type MOS transistors M1 and M2, and one anti-fuse element AF. In this case, the number of N-type MOS transistors is larger than in the conventional techniques, but only the voltage levels of the word line WLi and the bit line BLj are controlled and the counter electrode (second electrode) of the anti-fuse element AF is grounded. Thus, it is possible to perform the programming operation without controlling the voltage level of the counter electrode of the anti-fuse element AF.

Further, in the present invention, it is only necessary to set only two kinds of voltages, namely, the voltage VIO and the voltage VPP, as the voltage levels. Accordingly, it is possible to perform the programming operation and the read operation without controlling the voltage level of the counter electrode of the anti-fuse element AF.

In patent literature 3, an anti-fuse memory cell is provided with a read transistor for the read operation in addition to a transistor for the programming operation. In this case, in the read operation, a read data is read out by transferring the voltage on the bit line to the anti-fuse element via the read transistor. In the read operation, the transistor other than the transistor used for the program operation is used, and therefore the read operation does not become stable. For this reason, the control of ensuring the stability of the read operation is required, which results in making the configuration of the anti-fuse memory cell complex.

On the other hand, in the present invention, the transistors M1 and M2 are used for the programming operation and for the read operation. Especially, in the read operation, a read data can be read out by transferring the voltage VIO on the bit line BLi to the anti-fuse element AF via the transistor M2. Thus, the stability of the read operation can be ensured.

What is claimed is:

1. An anti-fuse memory cell comprising:
   a first transistor connected with a word line and configured to output a second voltage based on a first voltage supplied to said word line in a write mode;
   a second transistor connected with a bit line, and configured to output a third voltage supplied to said bit line when said second voltage is supplied to a gate of said second transistor in said write mode; and
   an anti-fuse element connected to a ground line, and having an insulator film,
   wherein said insulator film is set to a conductive state with said third voltage supplied from said second transistor.

2. The anti-fuse memory cell according to claim 1, wherein said second voltage is equal to a voltage which is lower than said first voltage by a threshold voltage of said first transistor, and
   said second transistor output said third voltage when a fourth voltage as a summation of said second voltage and said third voltage is higher than a first set voltage as a summation of a threshold voltage of said second transistor and said third voltage.

3. The anti-fuse memory cell according to claim 2, wherein said first transistor is connected between said word line and a first node and is always turned on,
   said second transistor is connected between said bit line and a second node and has a gate connected to said first node, and
   said insulator film of said anti-fuse element is connected between said second node and said ground line.

4. The anti-fuse memory cell according to claim 3, wherein said first voltage is always supplied to a gate of said first transistor.

5. The anti-fuse memory cell according to claim 3, wherein said anti-fuse element comprises an N-type MOS transistor and said insulator film is a gate oxide film of said N-type MOS transistor.

6. The anti-fuse memory cell according to claim 3, wherein said second transistor generates said fourth voltage due to a parasitic capacitance between said first node and said bit line in said write mode, and said second transistor outputs said third voltage from said bit line to said anti-fuse element through said second node, when said fourth voltage is higher than said first set voltage.

7. The anti-fuse memory cell according to claim 3, wherein said first transistor outputs said second voltage which is lower than said first voltage by the threshold voltage of said first transistor, in a read mode, and
   said second transistor generates a sixth voltage as a summation of said second voltage and a fifth voltage which is higher than said second voltage and is lower than said third voltage, when said fifth voltage is supplied to said bit line, and outputs said fifth voltage from said bit line to said anti-fuse element when said sixth voltage is higher than a second set voltage as a summation of the threshold voltage of said second transistor and said fifth voltage.

8. The anti-fuse memory cell according to claim 7, wherein said second transistor generates said sixth voltage due to a parasitic capacity between said first node and said bit line.

9. The anti-fuse memory cell according to claim 7, wherein said fifth voltage is equal to said first voltage.

10. A semiconductor memory device comprising:
    a memory cell array in which said anti-fuse memory cells are arranged in a matrix,
    wherein each of said anti-fuse memory cells comprises:
    a first transistor connected with a word line and configured to output a second voltage based on a first voltage supplied to said word line in a write mode;
    a second transistor connected with a bit line, and configured to output a third voltage supplied to said bit line when said second voltage is supplied to a gate of said second transistor in said write mode; and
    an anti-fuse element connected to a ground line, and having an insulator film, wherein said insulator film is set to a conductive state with said third voltage supplied from said second transistor to write a write data;
a plurality of word lines respectively connected with rows of said memory cell array;
a plurality of bit lines respectively connected with columns of said memory cell array;
a control circuit configured to output a row address and a column address in a write mode,
a word driver configured to select one of said plurality of word lines based on said row address from said control circuit to drive the selected word line with said first voltage in said write mode; and
a data driver configured to output said third voltage for the write data to one of said plurality of bit lines which is selected based on said column address from said control circuit in said write mode such that the write data is written in one anti-fuse memory cell connected with the selected word line and the selected column line.

11. The semiconductor memory device according to claim 10, wherein said control circuit outputs a row address and a column address in a read mode,
wherein said word driver selects one of said plurality of word lines based on said row address from said control circuit to drive the selected word line with said first voltage in said read mode,
wherein said semiconductor memory device further comprises:
a sense amplifier configured to select one of said plurality of column lines based on said column address from said control circuit and read a data stored in one anti-fuse memory cell which is connected with the selected word line and the selected bit line.

12. The semiconductor memory device according to claim 11, further comprising:
a precharging circuit configured to precharge the selected bit line with a precharge voltage for a preset time, and stop the precharge after the present time has elapsed.

13. The semiconductor memory device according to claim 10, wherein said second voltage is equal to a voltage which is lower than said first voltage by a threshold voltage of said first transistor, and
said second transistor output said third voltage when a fourth voltage as a summation of said second voltage and said third voltage is higher than a first set voltage as a summation of a threshold voltage of said second transistor and said third voltage.

14. The semiconductor memory device according to claim 13, wherein said first transistor is connected between said word line and a first node and is always turned on,
said second transistor is connected between said bit line and a second node and has a gate connected to said first node, and
said insulator film of said anti-fuse element is connected between said second node and said ground line.

15. The semiconductor memory device according to claim 14, wherein said first voltage is always supplied to a gate of said first transistor.

16. The semiconductor memory device according to claim 14, wherein said anti-fuse element comprises an N-type MOS transistor and said insulator film is a gate oxide film of said N-type MOS transistor.

17. The semiconductor memory device according to claim 14, wherein said second transistor generates said fourth voltage due to a parasitic capacitance between said first node and said bit line in said write mode, and said second transistor outputs said third voltage from said bit line to said anti-fuse element through said second node, when said fourth voltage is higher than said first set voltage.

18. The semiconductor memory device according to claim 11, wherein said first transistor outputs said second voltage which is lower than said first voltage by the threshold voltage of said first transistor, in a read mode, and
said second transistor generates a sixth voltage as a summation of said second voltage and a fifth voltage which is higher than said second voltage and is lower than said third voltage, when said fifth voltage is supplied to said bit line, and outputs said fifth voltage from said bit line to said anti-fuse element when said sixth voltage is higher than a second set voltage as a summation of the threshold voltage of said second transistor and said fifth voltage.

19. The semiconductor memory device according to claim 18, wherein said second transistor generates said sixth voltage due to a parasitic capacity between said first node and said bit line.

20. A method of accessing an anti-fuse memory cell, comprising:
supplying a first voltage to one of a plurality of word lines which is selected based on a row address in a write mode;
generating a second voltage based on the first voltage supplied to said selected word line by a first MOS transistor;
supplying a third voltage to one of a plurality of bit lines which is selected based on a column address in said write mode; and
outputting the third voltage to one electrode of an anti-fuse element by a second MOS transistor such that a data is written in said anti-fuse element, when said second voltage is supplied to a gate of said second MOS transistor in said write mode,
wherein the other electrode of said anti-fuse element is connected to a ground line, and an insulator film of said anti-fuse element is broken down with said third voltage such that said insulator film is set to a conductive state.

* * * * *